United States Patent
Na et al.

(10) Patent No.: US 9,400,293 B2
(45) Date of Patent: Jul. 26, 2016

(54) VOLTAGE SENSING CIRCUIT FOR CONVERTER

(71) Applicant: Hyundai Motor Company, Seoul (KR)

(72) Inventors: Jung Hwan Na, Hwaseong-si (KR); Tae Hwan Chung, Incheon (KR); Sang Hoon Kwak, Gwacheon-si (KR); Hyun Wook Seong, Seoul (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 124 days.

(21) Appl. No.: 14/053,265

(22) Filed: Oct. 14, 2013

(65) Prior Publication Data

US 2014/0354265 A1 Dec. 4, 2014

(30) Foreign Application Priority Data

May 30, 2013 (KR) .................. 10-2013-0061398

(51) Int. Cl.
*G01R 19/00* (2006.01)
*B60L 3/00* (2006.01)

(52) U.S. Cl.
CPC ............. *G01R 19/0084* (2013.01); *B60L 3/003* (2013.01)

(58) Field of Classification Search
CPC ... G01R 19/0084; G01R 19/00; H02M 3/157; H02M 3/1582; H02M 3/33515; H02M 2003/1552
See application file for complete search history.

(56) References Cited

U.S. PATENT DOCUMENTS

| 4,707,761 | A | * | 11/1987 | Podobinski | ..................... 361/94 |
| 5,940,257 | A | * | 8/1999 | Zavis | ..................... H02H 3/105 |
| | | | | | 361/115 |
| 7,919,950 | B2 | | 4/2011 | Uno et al. | |
| 8,232,780 | B2 | | 7/2012 | Uno | |
| 2003/0080718 | A1 | * | 5/2003 | McDonald et al. | ........... 323/286 |
| 2012/0169240 | A1 | * | 7/2012 | Macfarlane | .................. 315/152 |

FOREIGN PATENT DOCUMENTS

| JP | 2007097252 A | 4/2007 |
| JP | 10-2011-0018250 A | 2/2011 |
| KR | 10-2006-0101394 A | 9/2006 |
| KR | 10-2009-0090193 A | 8/2009 |
| KR | 10-2010-0054996 A | 5/2010 |
| KR | 10-2010-0114751 A | 10/2010 |
| KR | 10-1028024 B1 | 4/2011 |

OTHER PUBLICATIONS

Korean Office Action issued in Korean Application No. 10-2013-0061398 dated Apr. 30, 2014.
Korean Notice of Allowance dated Oct. 27, 2014 issued in Korean Patent Application No. 10-2013-0061398.

* cited by examiner

*Primary Examiner* — Son Le
(74) *Attorney, Agent, or Firm* — McDermott Will & Emery LLP

(57) ABSTRACT

A voltage sensing circuit of a converter senses input and output voltages of a converter with only one sensing circuit. The voltage sensing circuit is capable of reducing the number of the components for a controller and the volume thereof to save cost, and detecting whether the discontinuous mode (DCM) is entered or not, thereby to apply a separate control algorithm thereto when the DCM is entered.

2 Claims, 5 Drawing Sheets

US 9,400,293 B2

VOLTAGE SENSING CIRCUIT FOR CONVERTER

CROSS-REFERENCE TO RELATED APPLICATION

This application claims under 35 U.S.C. §119(a) the benefit of Korean Patent Application No. 10-2013-0061398 filed on May 30, 2013 the entire contents of which are incorporated herein by reference.

TECHNICAL FIELD

The present disclosure relates to a voltage sensing circuit for a converter, and more specifically, to an input and output voltage sensing circuit of a DC-DC converter.

BACKGROUND

Generally, a DC-DC converter (hereinafter, called converter) is mounted in a hybrid vehicle or an electric car, etc. so as to convert an input voltage into an output voltage suitable for a desired electric load. A controller senses input and output voltages of the converter in order to control the output voltage and protect the input voltage of the converter.

FIG. 1 is a plan view showing a circuit for sensing input and output voltages of a conventional converter, wherein an input voltage sensing circuit 500 is disposed at an input terminal of the converter, and an output voltage sensing circuit 502 is disposed at an output terminal of the converter.

According to related art, sensing circuits for sensing the voltages at an input terminal and at an output terminal are disposed at each side of the converter as described above, thus increasing the size and cost of a controller. Additionally, if the converter operates at a low load, it is impossible to detect whether the sensing circuits enter discontinuous mode (DCM), so a separate controlling algorithm cannot be applied thereto when the DCM is entered.

The background section is only for enhancement of understanding of the background of the present disclosure and should not be taken as an acknowledgement or any form of suggestion that this information forms the prior art already known to a person skilled in the art.

SUMMARY OF THE DISCLOSURE

The present disclosure has been made in an effort to solve the above-described problems associated with prior art. An aspect of the present disclosure provides a voltage sensing circuit of a converter in which input and output voltages of a converter all are sensed with only one sensing circuit, capable of reducing the number of the components for a controller and the volume thereof to save cost, and detecting whether DCM is entered or not, thereby to apply a separate control algorism thereto when the DCM is entered.

According to an exemplary embodiment of the present disclosure, a voltage sensing circuit of a converter includes an operational amplifier connected to both terminals of an inductor so as to detect voltages at both terminals of the inductor of the converter.

A full-wave rectification bridge may be interposed between the inductor and the operational amplifier so that two input terminals are connected to the full-wave rectification bridge in the operational amplifier.

The converter may be a boost converter in which an inductor and a diode are connected serially between the input terminal and the output terminal.

BRIEF DESCRIPTION OF THE DRAWINGS

The above and other features of the present disclosure will now be described in detail with reference to certain exemplary embodiments thereof illustrated the accompanying drawings which are given hereinbelow by way of illustration only, and thus are not limitative of the present disclosure.

DETAILED DESCRIPTION

Hereinafter, a voltage sensing circuit of a converter according to an exemplary embodiment of the present disclosure will be described, referring to the accompanying drawings.

Figure 1:
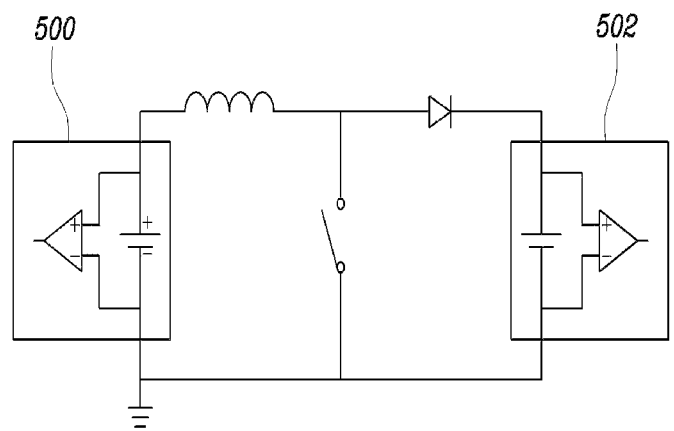
FIG. 1 is a view showing a voltage sensing circuit of a converter according to a conventional art.
Figure 2:
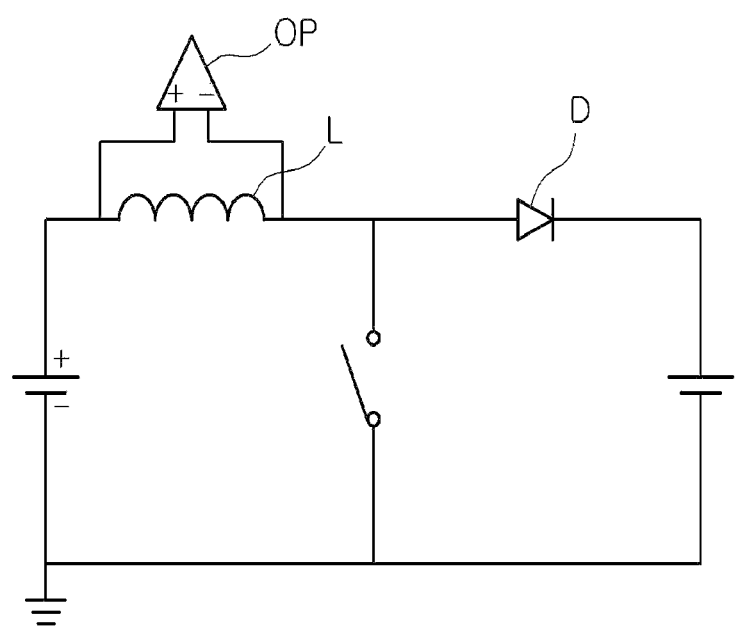
FIG. 2 is a view describing a voltage sensing circuit of a converter according to an embodiment of the present disclosure.
Figure 3:
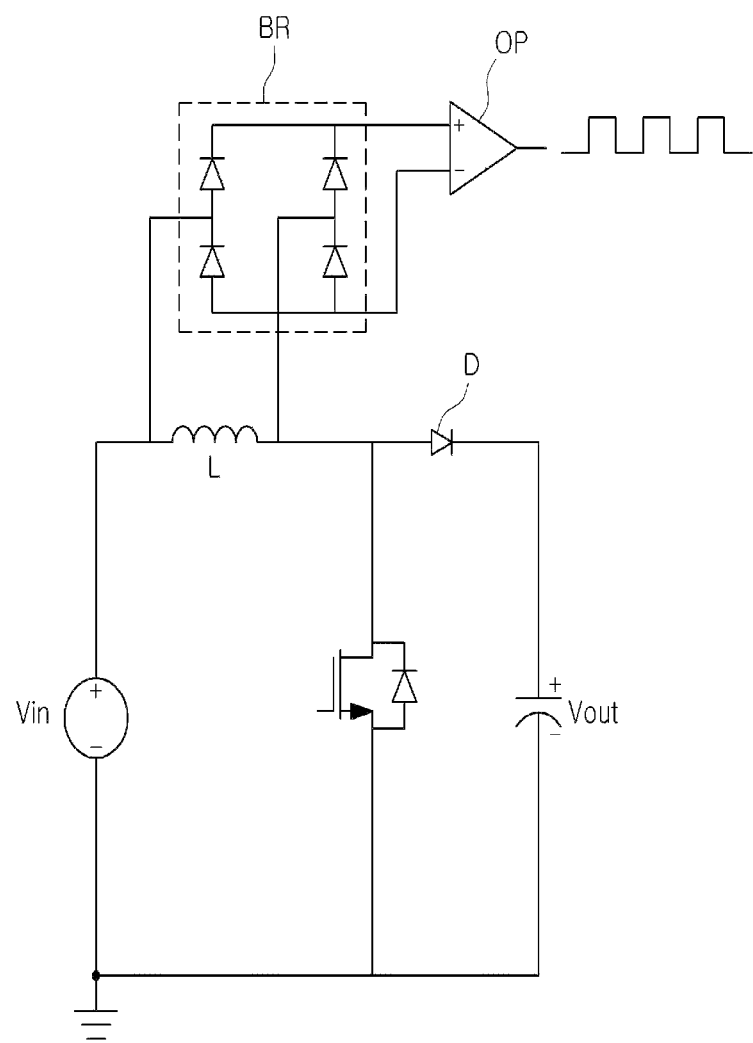
FIG. 3 is a view showing a voltage sensing circuit of a converter according to an exemplary embodiment of the present disclosure.

Referring to FIGS. 2 to 3, a voltage sensing circuit of a converter according to an exemplary embodiment of the present disclosure includes an operational amplifier OP connected to both terminals of an inductor L so as to detect voltages at both terminals of the inductor L of the converter.

The input voltage and the output voltage of the converter may be sensed on time divisional basis with connecting the operational amplifier OP to both terminals of the inductor L of the converter, as compared to the related art where sensing circuits provided separately at an input terminal and an output terminal.

In FIG. 3, the converter may be a boost converter wherein an inductor L and a diode D are connected serially between the input terminal and the output terminal. A full-wave rectification bridge BR is interposed between the inductor L and the operational amplifier OP, and two input terminals of the operational amplifier are connected to the full-wave rectification bridge BR.

Figure 4:
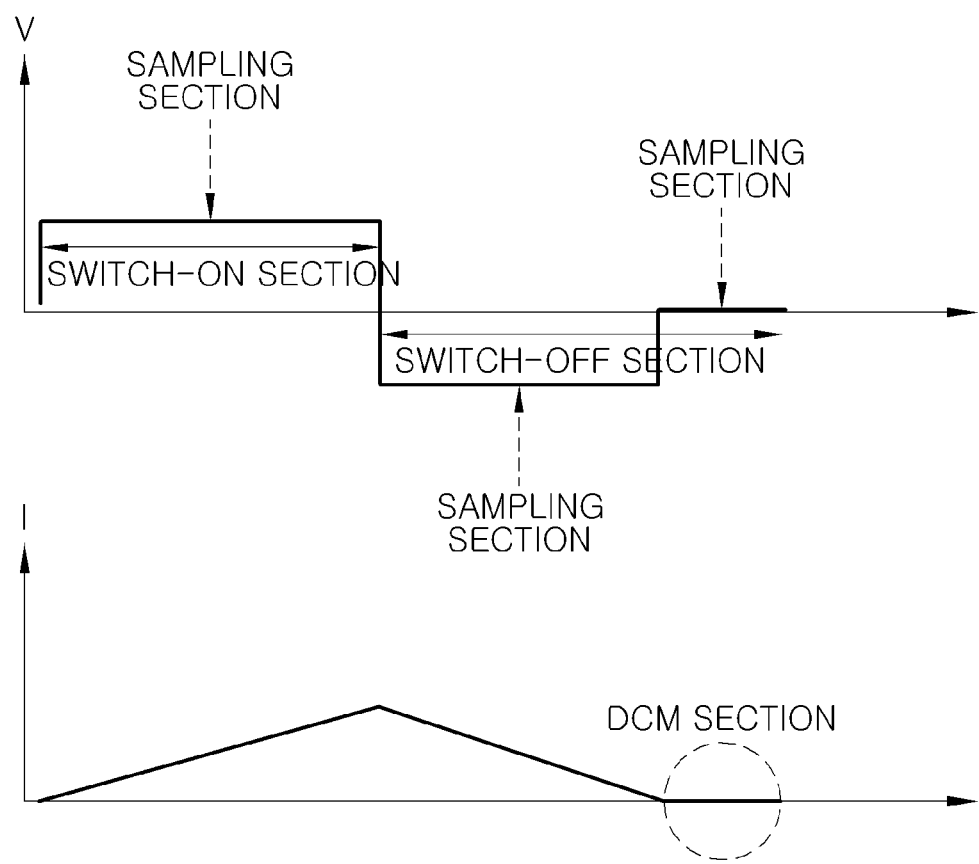
FIG. 4 is a graph showing a voltage and a current along the time at an output terminal of an operational amplifier of FIG. 3.
Figure 5:
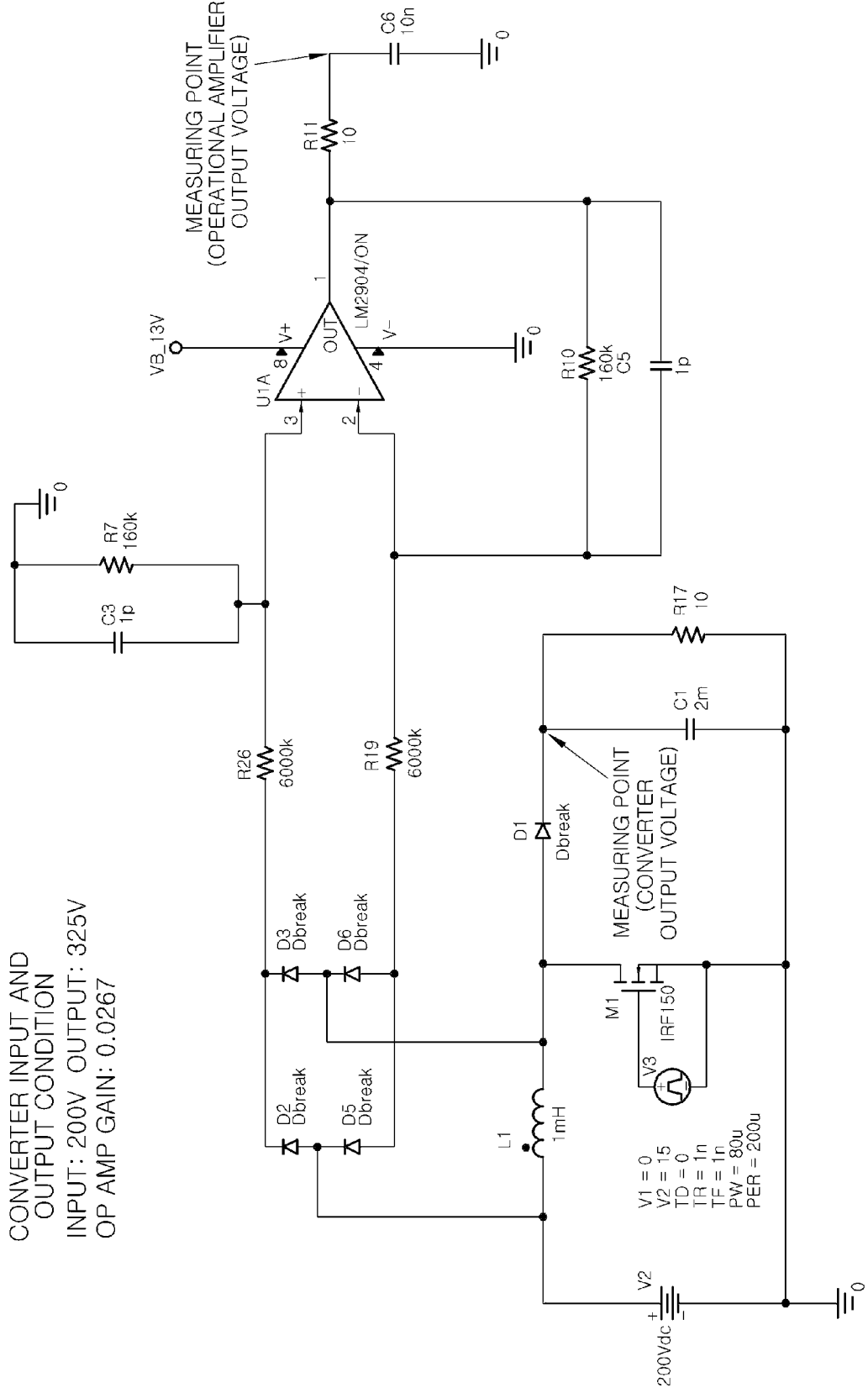
FIG. 5 is a view showing a configuration of an analog circuit according to PSPICE Simulation in order to verify the present invention.

Referring to FIG. 4, a maximum value and a minimum value of a voltage are exhibited alternatively depending upon switching characteristics of the converter at an output terminal of the operational amplifier OP during a switch-on section and a switch-off section per one cycle. At this time, the maximum value is proportional to the output voltage of the converter and the minimum value is proportional to the input voltage of the converter, thereby alternatively sensing the input voltage and the output voltage of the converter with the output voltage of the operational amplifier OP.

Figure 6:
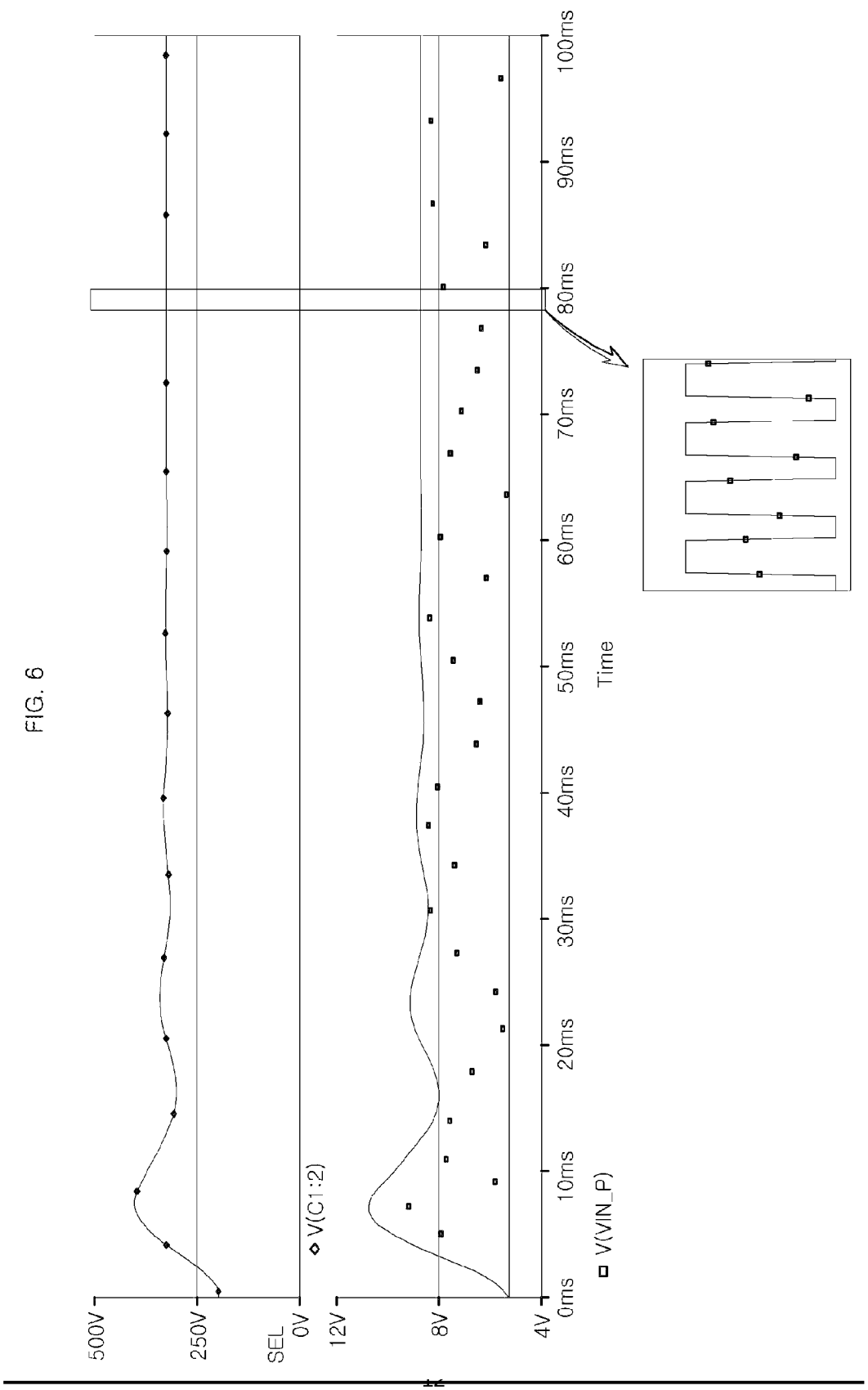
FIG. 6 is a graph showing a result of the PSPICE Simulation of FIG. 5, wherein a converter output voltage and an operational amplifier output voltage are exhibited with respect to time.

Referring to FIG. 6, the converter output voltage is 325.57V at a point magnifying an output of the operational amplifier OP from the result of the PSPICE Simulation. At this time a maximum value of the output of the operational amplifier OP is 8.66V and a minimum value is 5.296V wherein the converter input voltage can be estimated by substituting the maximum and minimum values in the following expression, that is, from a relation of 325.57V to 8.66V=X (input voltage) to 5.296V, X=199.1V is calculated, At this time the error is −0.9V, therefore the converter input voltage may be calculated from the output voltage of the operational amplifier OP sensed at a satisfactory level of accuracy.

Referring to FIG. 4, the output of the operational amplifier varies obviously during a switch-on section and a switch-off section with switch on/off operations of the converter. The output voltage and current of the operational amplifier OP are 0s on the DCM section of the switch-off section, as illustrated, thereby detecting whether the DCM is entered or not, so a separate control algorith can be applied to the controller.

According to the present disclosure, both input and output voltages of a converter are sensed with only one sensing circuit, capable of reducing the number of the components for a controller and the volume thereof to save cost, and detecting whether the DCM is entered or not, thereby to apply a separate control algorism thereto when the DCM is entered.

While the present disclosure will be described in conjunction with exemplary embodiments, it will be understood that present description is not intended to limit the invention to the exemplary embodiments. On the contrary, the disclosure is intended to cover not only the exemplary embodiments, but also various alternatives, modifications, equivalents and other embodiments, which may be included within the spirit and scope of the disclosure as defined by the appended claims.

What is claimed is:

1. A voltage sensing circuit of a converter, in which an inductor and a diode are connected serially between an input terminal of the converter and an output terminal of the converter, comprising an operational amplifier connected to both terminals of the inductor and configured to detect voltages at both terminals of the inductor of the converter,
    wherein a full-wave rectification bridge is interposed between the inductor and the operational amplifier, and two input terminals of the operational amplifier are connected to the full-wave rectification bridge,
    wherein an output voltage and an input voltage of the converter are sensed alternatively according to a maximum value and a minimum value of a voltage at an output terminal of the operational amplifier, respectively,
    wherein the maximum value is proportional to the output voltage of the converter and the minimum value is proportional to the input voltage of the converter, and
    wherein both the output voltage and an output current of the operational amplifier are 0s, when a discontinuous mode is entered.

2. The voltage sensing circuit of a converter of claim 1, wherein the converter is a boost converter.

* * * * *